United States Patent [19]
Oh

[11] Patent Number: 5,239,511
[45] Date of Patent: Aug. 24, 1993

[54] LOW POWER REDUNDANCY CIRCUIT FOR A MEMORY DEVICE

[75] Inventor: Jong H. Oh, Kyoungkido, Rep. of Korea

[73] Assignee: Hyundai Electronics Industries Co., Ltd., Kyoungkido, Rep. of Korea

[21] Appl. No.: 654,243

[22] Filed: Feb. 12, 1991

[30] Foreign Application Priority Data

Feb. 24, 1990 [KR] Rep. of Korea ............... 1990-2379

[51] Int. Cl.$^5$ ............................................. G11C 11/40
[52] U.S. Cl. .................................. 365/227; 365/225.7
[58] Field of Search ................... 365/200, 225.7, 227, 365/230.08; 371/10.3

[56] References Cited

U.S. PATENT DOCUMENTS

4,546,455  10/1985  Iwahashi et al. ............ 365/225.7 X
4,829,480   5/1989  Seo ...................................... 365/200

Primary Examiner—Steven Mottola
Attorney, Agent, or Firm—Darby & Darby

[57] ABSTRACT

The invention relates to a low power redundancy circuit used in memory device and comprises operation control fuse circuit 47, an OR gate 48, a switching circuit 56, a fuse circuit 45, and a latch-back circuit 57. The latch-back circuit 57 is composed of p channel MOSFET 53 and inverters.

3 Claims, 5 Drawing Sheets

LOW POWER REDUNDANCY CIRCUIT FOR A MEMORY DEVICE

BACKGROUND OF THE INVENTION

This invention relates to a low power redundancy circuit for a memory device for reducing power consumption in the redundancy circuit by using an evaluation signal of short pulse width and a latch-back MOSFET.

The prior arts regarding such redundancy circuit are illustrated in FIG. 1 through FIG. 3. FIG. 1 shows an address suppression redundancy circuit having a fuse circuit 1 which comprises fuses 6 to 13 and an address gate circuit 14 to 25 connected or disconnected by the fuses 6 to 13, and a dynamic-fused NOR gate circuit 3 and 4 inputting a control signal ($\phi$EN).

If a column address is three (0011 in binary bit) and the column address is operated erroneously, the inputs of the address lines $\overline{A3},\overline{A2},A1$ and A0 should be in a high state and the fuses 6,8,11, and 13 in the fuse circuit 1 are disconnected. In this manner, the erroneous address is replaced.

In READ/WRITE operation of FIG. 2, if the column address of three is inputted and a time section is $t<T0$,(that is in a stand-by state,) the input signal ($\overline{\phi EN}$) is in a high state (Vdd), and MOSFET 4 is in an "ON" state, and then an output(SPARE) 5 to a redundancy column decoder 2 is in a low state(ground).

If the input signal($\overline{\phi EN}$) is changed to a low state at t=T0, MOSFET 4 turns "OFF" and MOSFET 3 turns "ON", and N channel MOSFET's 15,17,18, and 20 all turn "OFF", and then the output(SPARE) 5 is changed to a high state since MOSFET's 6,8,11, and 13 are here ruled out by the above fuses disconnection.

The output (SPARE) 5 operates the redundancy column decoder 2, or cuts off its operation. Since the column decoder including the erroneous column address is excluded by the logic operation of the redundancy circuit, it is not necessary to separate the erroneous column part from a word line driver of the column decoder.

But if the replaced column address is not inputted or the other column address is inputted, at least one N channel MOSFET turns "ON", a current induced through MOSFET 3 from the power Vdd flows to the ground through the N channel MOSFET of the fuse circuit 1 and the output(SPARE) 5 needs time to be changed to a high state. Accordingly, the prior art method also has a problem consuming more power.

FIG. 3 shows another prior art redundancy circuit for improving the prior art's problem.

In this redundancy circuit, an operation control fuse circuit 33 is composed of three MOSFET's 39 through 41 and a fuse 42. The fuse 42 performs a function to connect the power, VDD, and the output node of the operation control fuse circuit 33 if the fuse is not disconnected. Since two inputs to the OR gate 34 maintain a high state by the output ($\overline{MASTER}$) 37 of the operation control fuse circuit 33 without respect to the other input ($\overline{\phi EN}$) in all time sections(t), MOSFET 35 always becomes "OFF" and MOSFET 36 always becomes "ON". Accordingly, this doesn't cause power consumption related with this operation.

But in using the redundancy circuit, if the fuse 42 is disconnected, this is the same as the circuit of FIG. 1. That is, if a particular column address is replaced, when $T0 \leq t < T1$, MOSFET 35 and the particular N channel MOSFET 36 turns "ON" in inputting this programmed column address and other normal column addresses. And then in this state, unnecessary power consumption still exists.

SUMMARY

It is an object of the present invention to provide a low power redundancy circuit for greatly reducing power consumption in a redundancy circuit by using an evaluation signal of short pulse width and a latch-back MOSFET.

To achieve this object, this invention comprises operation control fuse means for controlling an operation of the redundancy circuit; OR gate means for performing OR logic of an output signal of the operation control fuse means and an evaluation signal of short pulse width; switching means for receiving an output signal of the OR gate means and a control signal($\overline{\phi EN}$), and for performing a switching function according to the signals; a fuse circuit connected to the switching means, comprising a plurality of address signal transmission gates and a plurality of fuses connected to the address signal transmission gates; and a latch-back circuit connected to the switching means and the fuse circuit, comprising a latch-back MOSFET.

BRIEF DESCRIPTION OF THE DRAWINGS

The invention will be readily understood from the following more detailed description presented in conjunction with the following drawings, in which.

DETAILED DESCRIPTION OF THE PREFERRED EMBODIMENTS

Figure 4:
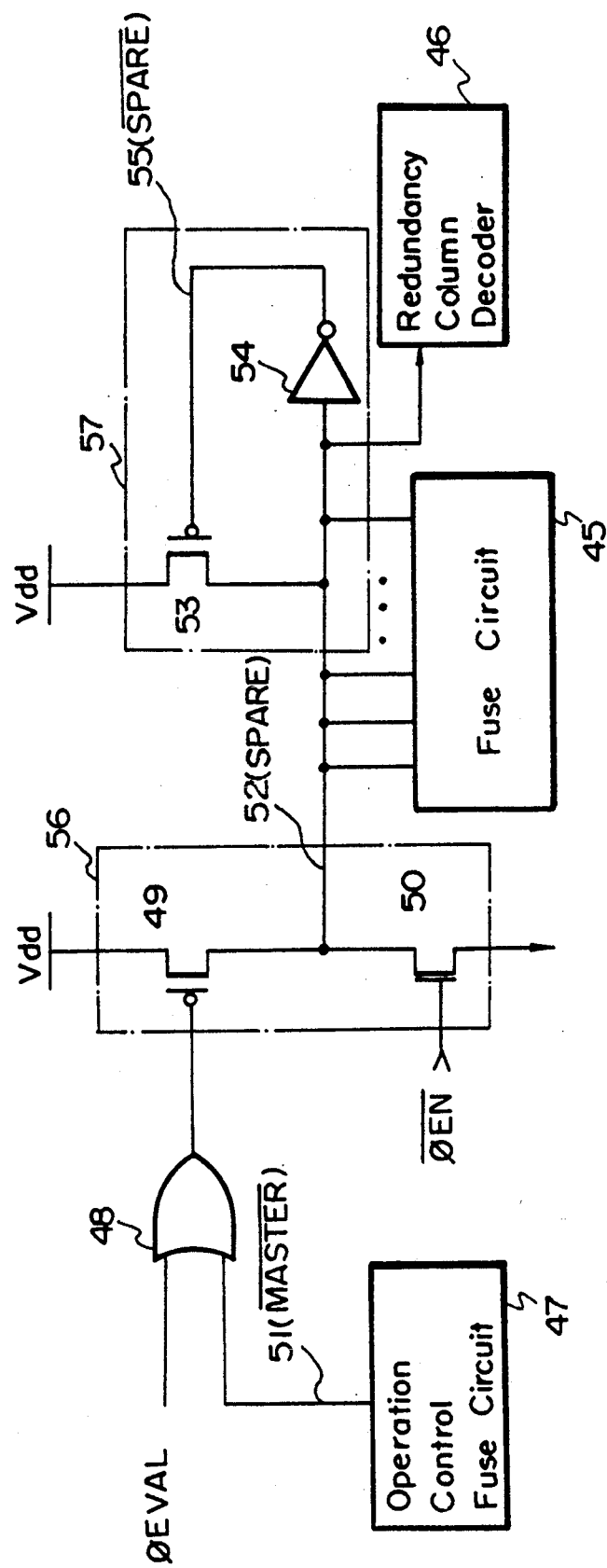
FIG. 4 is a construction diagram of the invention.
Figure 5:
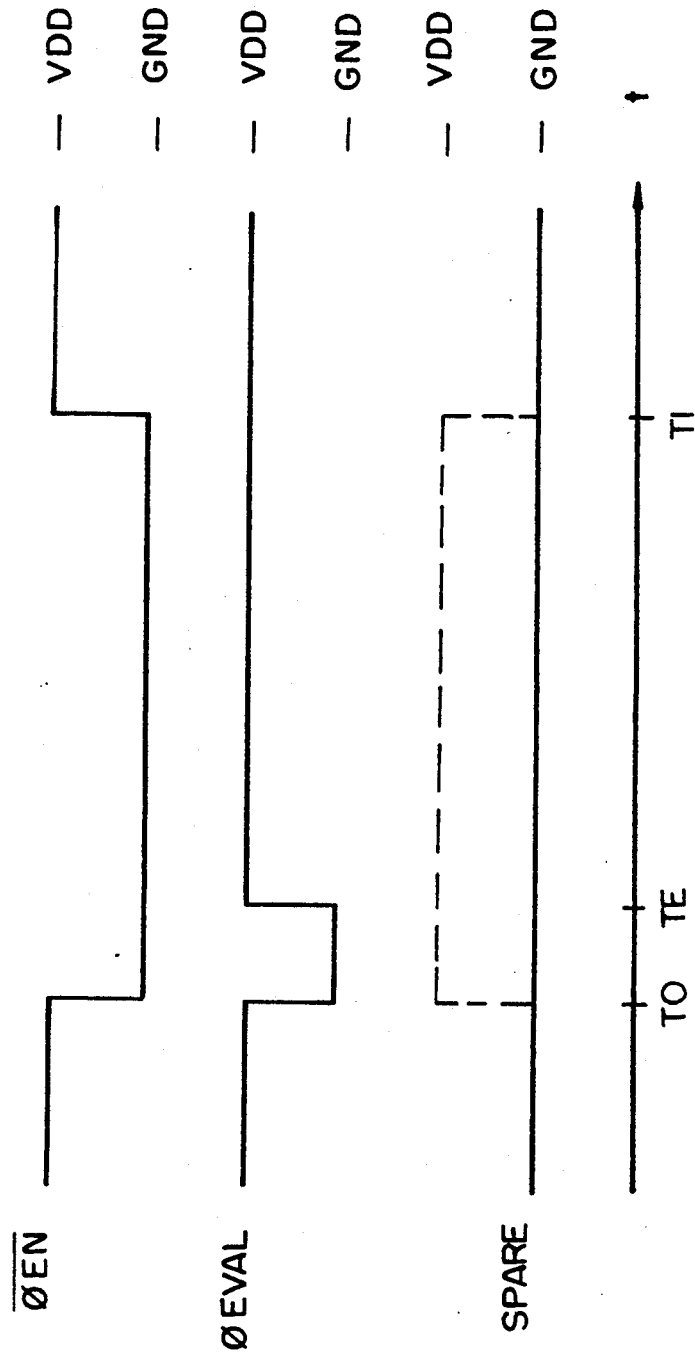
FIG. 5 is a timing diagram showing the signal relation for important parts of FIG. 4.

FIG. 4 is a construction diagram of the invention, and FIG. 5 is a timing diagram of showing the signal relation for important parts of FIG. 4.

In the drawings, the reference number 45 shows a fuse circuit, 46 a redundancy column decoder, 47 an operation control fuse circuit, 56 a switching circuit, 57 a latch-back circuit, 48 an OR gate, 54 an inverter, and 49,50, and 53 MOSFET's respectively.

As shown in FIG. 4, this invention is composed of the fuse circuit 45 including a plurality of fuses and a plurality of MOSFET's, a redundancy column decoder 46, an operation control fuse circuit 47 including several MOSFET's and a fuse, a switching circuit including two MOSFET's 49 and 50, a latch-back circuit including an inverter 54 and a latch-back MOSFET 53, and an OR gate 48.

Figure 1:
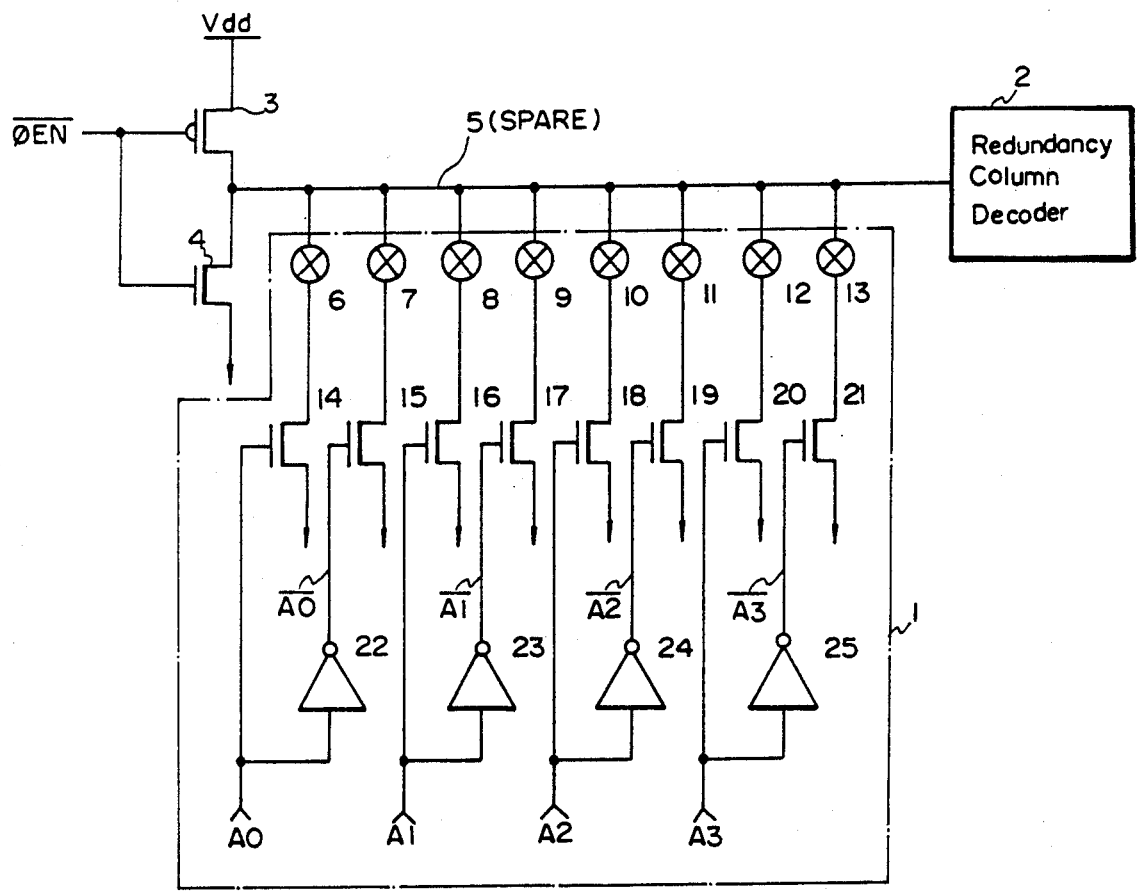
FIG. 1 is a construction diagram of a prior art redundancy circuit.
Figure 2:
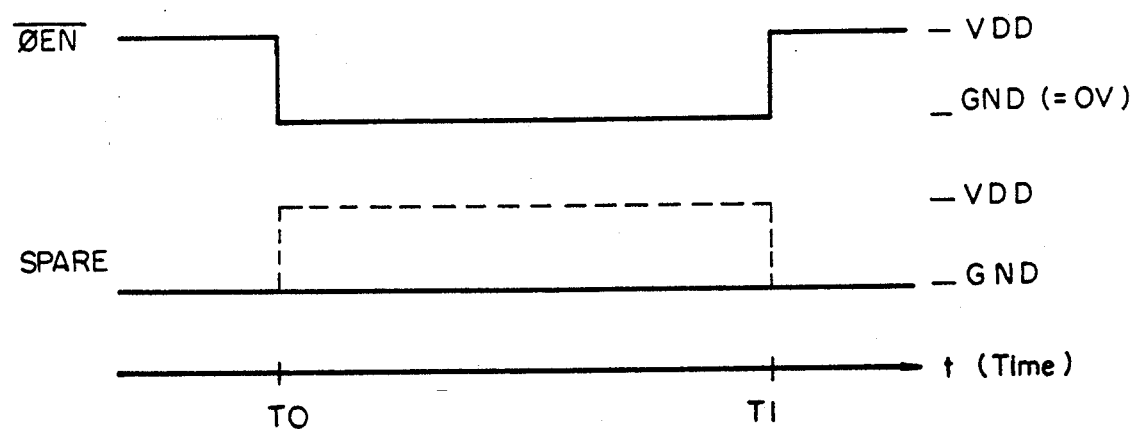
FIG. 2 is a timing diagram showing the signal relation for important parts of FIG. 1.
Figure 3:
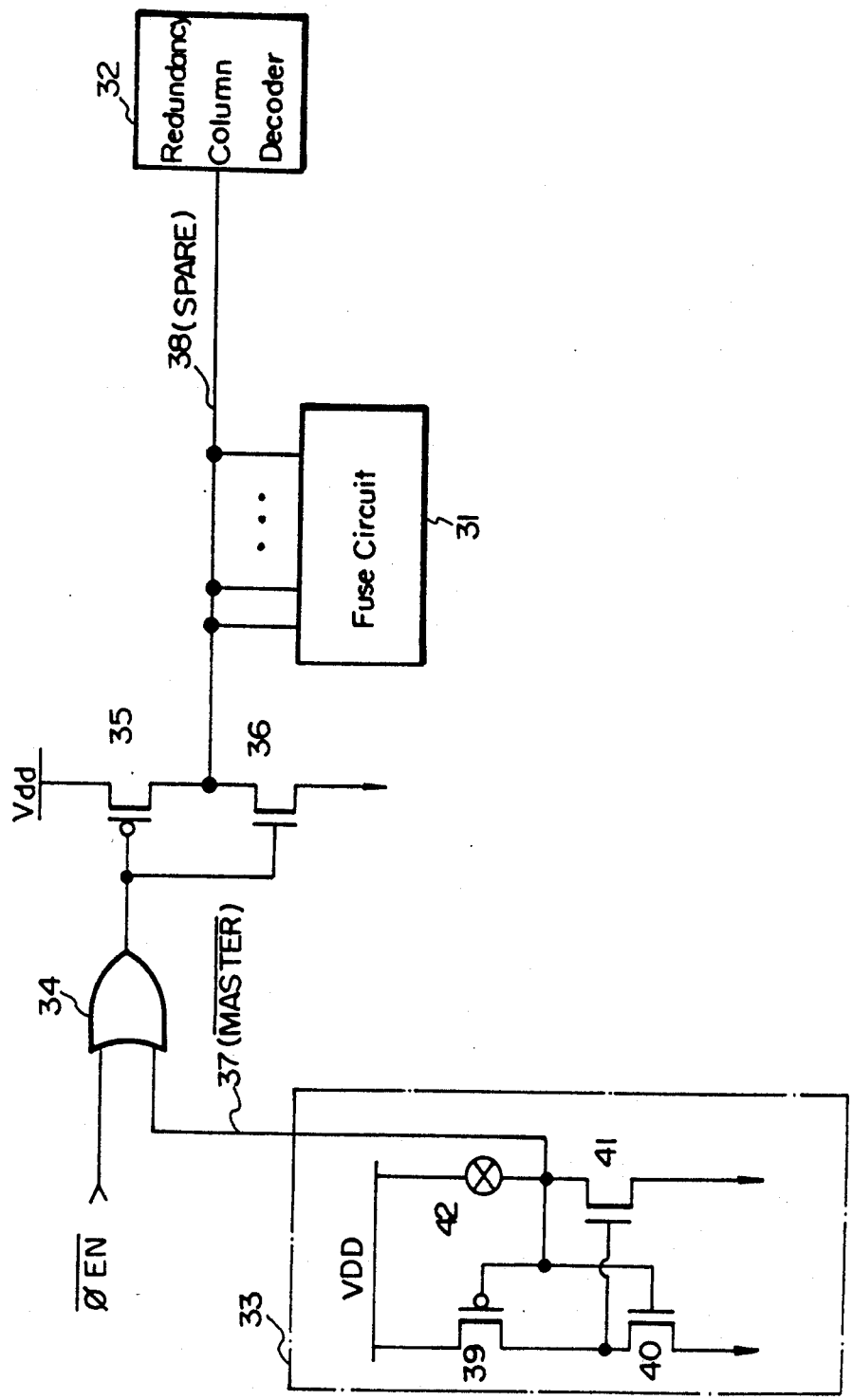
FIG. 3 is a construction diagram of another prior art redundancy circuit.

If the fuse (the reference number 42 in FIG. 3) of the operation control fuse circuit 47 is disconnected in this invention, a section of $t<T0$ of FIG. 5 corresponds to a stand-by state, the input signals ($\overline{\phi EN}$ and $\phi EVAL$) are in a high state, MOSFET 50 turns "ON" and MOSFET 49 turns "OFF", and the output(SPARE) 52, the control signal of the redundancy column decoder 46, maintains a low state.

If, when TO≦t<TE, the input signal ($\overline{\phi EN}$) is changed to a low state and the evaluation signal($\phi$EVAL) is changed to a low state, MOSFET 49 turns "ON" and MOSFET 50 turns "OFF", and a current is induced to the output (SPARE) line through MOSFET 49 from the power (Vdd). At this time, if the column address corresponds to the programmed column address of the fuse circuit 45, the output (SPARE) 52 changes to a high state, and then it is changed to a low state through the inverter 54, In this manner, the latch-back MOSFET 53 turns "ON".

Although, when t=TE, the evaluation ($\phi$EVAL) signal is again changed to a high state and MOSFET 49 turns "OFF", the output (SPARE) until the time (T1) MOSFET 50 becomes "ON", can maintain a high state by providing a current of the latch-back MOSFET 53.

But provided that the input of the column address is not a replaced particular column address that is used for column redundancy programming when TO≦t<TE, (i.e., when the evaluation signal is in a high state), unnecessary power consumption can be caused because a current induced through MOSFET 49 from the power(Vdd) flows to ground through N channel MOSFET. The pulse width of the evaluation signal is very short and is approximately 5 ns, since the pulse section is the time MOSFET 53 becomes "ON".

If MOSFET's have same current gain, the power consumption reduction ratio(RI) can be shown as follows:

$$RI = 1 - \frac{TE - TO}{T1 - TO}$$

As explained in detail above, this invention is able to implement a low power redundancy circuit by using an evaluation signal of short pulse width and a latch-back MOSFET for greatly reducing the power consumption in the redundancy circuit.

What I claim:

1. A low power redundancy circuit used in a memory device comprising:
    operation control fuse means for controlling an operation of the redundancy circuit;
    OR gate means for performing OR logic on an output signal of the operation control fuse means and an evaluation signal of short pulse width;
    switching means for receiving an output signal of the OR gate means and a control signal ($\overline{\phi EN}$), and for performing a switching function according to the signals;
    a fuse circuit connected to the switching means, comprising a plurality of address signal transmission gates and a plurality of fuses connected to the address signal transmission gates; and
    a latch-back circuit connected to the switching means and the fuse circuit, comprising a latch-back MOSFET.

2. A low power redundancy circuit according to claim 1, wherein the switching means include two MOSFET's connected in series with each other.

3. A low power redundancy circuit according to claim 2, wherein the latch-back circuit includes inverting means connected to the latch-back MOSFET.

* * * * *